(12) United States Patent
Muendelein

(10) Patent No.: US 6,674,002 B2
(45) Date of Patent: Jan. 6, 2004

(54) DEVICE FOR ACCOMODATING ELECTRONIC COMPONENTS

(75) Inventor: Olaf Muendelein, Iserlohn (DE)

(73) Assignee: Optimel Schmelzgusstechnik GmbH & Co. KG, Iserjohn (DE)

(*) Notice: Subject to any disclaimer, the term of this patent is extended or adjusted under 35 U.S.C. 154(b) by 0 days.

(21) Appl. No.: 10/204,778

(22) PCT Filed: Feb. 15, 2001

(86) PCT No.: PCT/EP01/01666
§ 371 (c)(1),
(2), (4) Date: Aug. 23, 2002

(87) PCT Pub. No.: WO01/63995
PCT Pub. Date: Aug. 30, 2001

(65) Prior Publication Data
US 2003/0010518 A1 Jan. 16, 2003

(30) Foreign Application Priority Data
Feb. 24, 2000 (DE) .......................................... 100 08 695

(51) Int. Cl.⁷ .............................................. H01L 23/28
(52) U.S. Cl. ................................ 174/52.2; 264/272.11; 257/687; 257/787
(58) Field of Search ................ 174/52.2, 52.3, 174/52.4; 361/717, 718, 728, 730, 747, 752, 759; 257/687, 710, 787; 264/272.11

(56) References Cited

U.S. PATENT DOCUMENTS

| | | | |
|---|---|---|---|
| 4,443,655 A | | 4/1984 | Van Dyk Soerewyn |
| 4,924,351 A | * | 5/1990 | Kato et al. ................... 361/718 |
| 5,526,234 A | * | 6/1996 | Vinciarelli et al. ......... 361/740 |
| 5,880,401 A | | 3/1999 | Leischner et al. |
| 6,506,630 B2 | * | 1/2003 | Mastboom et al. ......... 438/124 |

FOREIGN PATENT DOCUMENTS

| | | |
|---|---|---|
| DE | 33 15 230 A1 | 10/1984 |
| DE | 40 33 999 C2 | 8/1993 |
| DE | 196 34 673 C2 | 8/1998 |
| EP | 0 482 419 A1 | 4/1992 |
| GB | 1 587 998 | 4/1981 |

\* cited by examiner

Primary Examiner—Dean A. Reichard
Assistant Examiner—Carmelo Oliva
(74) Attorney, Agent, or Firm—Stephen D. Harper; Glenn E. J. Murphy

(57) ABSTRACT

A device for accomodating at least one, preferably electrical or electronic, component, comprising a housing forming an interior defined by an inner wall surface, in which interior the at least one component is arranged, the at least one component occupying less than all of the interior of the housing, the balance being filled with a casting material, wherein a projection from the inner wall surface encircles the interior and forms an undercut filled by the casting material to lock the casting material to the inner wall surface.

22 Claims, 2 Drawing Sheets

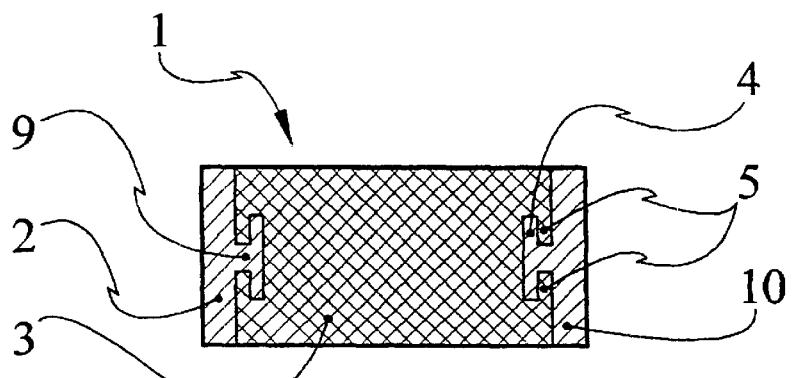
Fig. 1
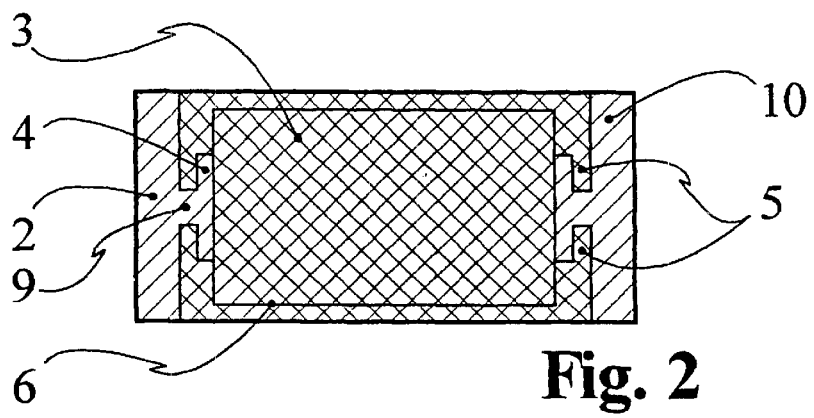
Fig. 2
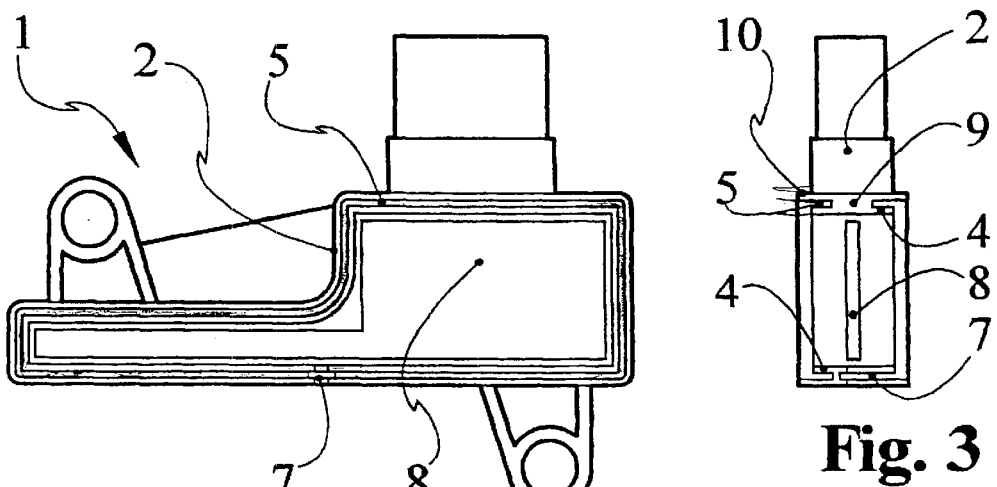
Fig. 3
Fig. 4

DEVICE FOR ACCOMODATING ELECTRONIC COMPONENTS

CROSS-REFERENCE TO RELATED APPLICATIONS

This application is a U.S. National Stage application filed under 35 U.S.C. §371, claiming priority of International Application No. PCT/EP01/01666, filed Feb. 15, 2001 in the European Patent Office, and DE 100 08 695.0, filed Feb. 24, 2000 in the German Patent Office, under 35 U.S.C. §§119 and 365.

BACKGROUND OF THE INVENTION

The invention relates to a device for accommodating at least one—preferably electrical or electronic—component, comprising a housing, in the interior of which the at least one component is arranged, the interior of the housing being filled with a casting material.

It is known to use hot-melt adhesives for the production of moulded parts or for the sealing of plug connectors or as an encapsulating mass for electrical or electronic components. Thus, hot-melt adhesives have been employed, for example, for years for water-tight plug connectors. In addition, there are also special hot-melt adhesives on a polyamide base (for example, the product Macromelt (Registered Trade Mark) marketed by the applicant) which provide more than just a water-tight adhesion. Such an adhesive prevents, in particular, not only the ingress of moisture into the plug, but also imparts mechanical strength to the plug connector and fulfills further tasks which were previously fulfilled by additional, high-cost plastic parts. Hot-melt adhesives of this kind are based on, for example, polyamide and have a melt range from 120 to 180° C. They adhere to many plastics, such as polyethylene, polyvinylchloride and polyamide, and have low viscosity. In one method used for injection moulding, the heated hot-melt adhesive is injected into a tool. The liquid melt is suitable for flowing around filigree components, even without high pressure, without impairing the function of the components. The adhesive penetrates into the smallest spaces even at a pressure between 5 and 10 bars. The low pressure has the consequence that the entire method is very economic, since the machine can be designed for this low loading. The tools can be produced favourably in cost from aluminium. This method is suitable for, for example, encapsulating cable passages or for wire insulation. The encapsulation of switches, plugs, contacts, sensors and other electronic components is equally possible and opens up a further field of use. Such a method can be used wherever electrical currents flow and sealing is necessary.

In principle it is possible to either fill a housing, in which the electronic component is arranged, with cast hot-melt adhesive or to produce the entire housing itself from hot-melt adhesive. However, such a housing consisting solely of hot-melt adhesive has only a low mechanical strength compared with a plastic material housing and accordingly can be used only in specific applications.

In the case of use of devices according to category with a plastic material housing and an internal filling of casting material consisting of hot-melt adhesive the problem arises, however, that under temperature change of the finished units the hot-melt adhesive detaches again from the housing wall so that the electronic component or components in the housing is or are no longer sealed. For this reason it has been usual in the past to injection-mould hot-melt adhesive completely externally around the housing. However, due to space considerations this is not always possible.

It is therefore the object of the invention to further develop a device according to category, with maintenance of the mechanical strength thereof, so that it is reliably sealed towards the outside even in the case of temperature changes.

DESCRIPTION OF THE INVENTION

According to the invention this object is met by a device of the kind stated in the introduction in the manner that the housing is provided at the inner side with at least one encircling projection having an undercut.

When filling the housing, which is furnished with at least one electronic component or the like, with casting material the casting material then also flows into the region between the housing inner wall and the encircling projection and is thereby, so to speak, self-locked to the housing. Even in the case of temperature change tests, i.e. extreme temperature changes, it is ensured that the casting material cannot detach from the housing inner wall, so that the device as a whole remains reliably sealed.

In that case it is then preferably provided that the projection is arranged in the centre region of the housing, so that the casting mass is then retained approximately symmetrically in the housing.

As known per se, the casting material can with particular advantage consist of hot-melt adhesive on a polyamide base. Preferably there can then be used an adhesive placed on the market by the applicant under the designation Macromelt (Registered Trade Mark). Alternatively, other hot-melt adhesives, for example on a polyurethane or polyester base, can also be advantageously used.

If the housing is to be injection-filled with the casting material the housing advantageously has at least one injection bore for the casting material in the region of the projection. The injection bore then penetrates the projection which, however, is otherwise formed to be encircling.

The projection is Connected with the outer wall of the housing in rigid manner it the projection encircles continuously and is connected with the outer wall of the housing by means of a strut- or bridge-like connecting wall. In that case, it is preferably farther provided that the projection and connecting wall are together formed to be cross-sectionally T-shaped.

In a particularly preferred development the invention further provides that the projection encircles in sections and is connected with the outer wall of the housing by means of a respective connecting wall for each section. This enables particularly good flowing of the bonding material into the gap between the projection and the outer wall and prevents bubble formation in the region behind the undercutting of the projection. In addition, this enables production of the housing of the device according to the invention in a plastic injection moulding process with uniform wall thicknesses without the risk of shrink holes in the internal surface of the housing.

Finally, as also provided by the invention it is of particular advantage in the case of this embodiment if the connecting wall is formed to be circular in each section.

DESCRIPTION OF THE DRAWINGS

The invention is explained in more detail in the following, by way of example, with reference to the drawing, in which:

FIG. 1 shows a cross-section of a device according to the invention,

FIG. 2 shows the device according to FIG. 1, with emphasis of the sealed internal region, FIG. 3 shows a cross-section through a modified embodiment, FIG. 4 shows a side view of the embodiment according to FIG. 2.

In the following the same or analogous elements or component parts of the various embodiments are provided in each instance with the same reference numerals.

Figure 5:
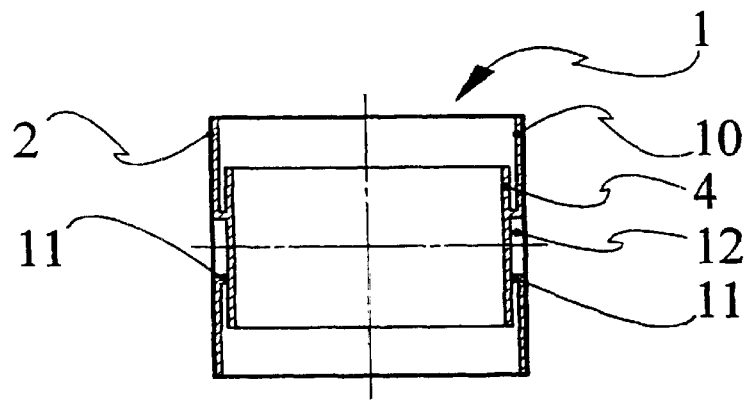
FIG. 5 shows a cross-section through a third embodiment.

A device according to the invention is denoted generally by 1 in FIG. 1. This device 1 comprises, in this embodiment, a tubular housing 2, for example of plastic, and serves for sealed accommodation of a schematically illustrated electronic component 8. After arrangement of this electronic component 8 in the housing 2, the housing 2 is filled out in the interior with a casting material 3, preferably a hot-melt adhesive on a polyamide base. This can be, for example, the adhesive known as Macromelt (Registered Trade Mark).

In order to ensure that the interior of the housing 2 remains sealed even in the case of temperature fluctuations or, in particular, in the case of temperature change tests, the housing 2 is provided at the inner side with at least one encircling projection 4 having an undercut. This projection 4 is preferably formed—as in the first two embodiments—to be T-shaped and is preferably arranged in the centre region of the housing 2. The projection 4 is fixedly connected with the outer wall 10 of the housing 2 by way of a web-shaped connecting wall 9 similarly formed to be encircling, the connection preferably being produced integrally by means of a plastic injection-moulding process.

By virtue of this design, casting material introduced in liquid state optionally under slightly increased pressure flows in the device 1 also into the spaces 5 between the projection 4 and the inner wall surface of the housing 2. The casting material 3 hardens here as well, so that the casting material 3 is, so to speak, locked in these spaces 5. If the housing 2 and the casting material 3 now expand differently in the case of temperature changes, it is nevertheless ensured, since the casting material is fixed by the locking in the spaces 5, that the device 5 remains sealed to the outside. This sealed region is indicated in FIG. 2 by a rectangle 6, and in the region of this rectangle 6 there is available a reliably sealed region within the device 1 in which electronic components can be arranged to be securely sealed by encapsulation with hot-melt adhesive.

A further embodiment of a device according to the invention is illustrated in FIGS. 3 and 4. The device again denoted by 1 here has a housing 2 of different form. As in the case of the embodiment according to FIGS. 1 and 2, the housing 2 is provided at the inner side with an encircling, T-shaped projection 4. In order to enable injection of the casting material in the case of a housing 2 formed in that manner, the housing 2 has at least one injection bore 7 for the casting material 3 in the region of the projection 4. Apart from this injection bore 7, the projection 4 is, however, otherwise formed to be encircling so as to ensure the sealing function.

Figure 6:
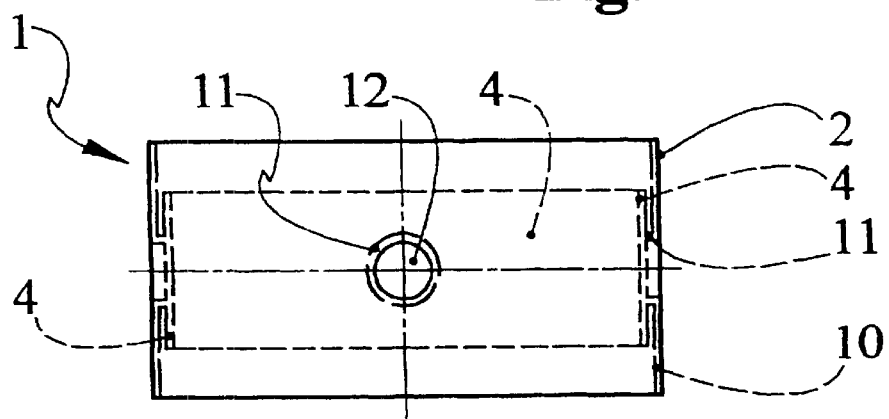
FIG. 6 shows a plan view of the embodiment according to FIG. 5
Figure 7:
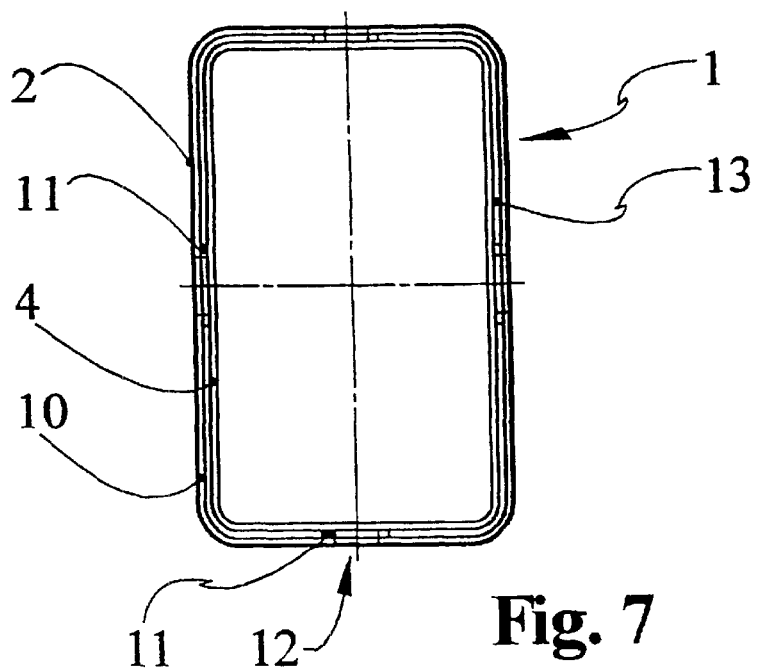
FIG. 7 shows a side view of the embodiment according to FIGS. 5 and 6.

In the case of the embodiment, which is illustrated without a casting material filling and without an electronic component, according to FIGS. 5 to 7 the connecting wall 11 connecting the encircling projection 4 with the outer wall 10 is constructed only in sections and as an annular or circular connecting wall 11. In total the device 1 in the embodiment according to FIGS. 5 to 7 has four sections each with a respective circularly arranged connecting wall 11. Considered from the outer side, four bowl-like depressions 12 are formed in these sections in the outer wall 10 of the housing 2. It is also possible, however, to form these regions to have a complete surface and thus design the outer surface of the housing 2 to be smooth or free of depressions. Since the connection wall 11 is formed to encircle only in sections and no longer continuously as in the embodiments according to FIGS. 1 to 4, there results at the regions of the connecting walls 11 a substantially open, encircling gap 13 between the inner side of the encircling wall 10 and the encircling projection 4 of the housing 2, which is open outside the annular wall regions 11 also in the direction of viewing of the plan view according to FIG. 7. In the case of the embodiments according to FIGS. 1 to 4 the connecting wall 9 is thereagainst formed with a parallel course continuously between the projection 4 and outer wall 10, so that in the direction of viewing of the side view according to FIG. 4 the gap-like spaces 5 are separated from one another by means of the connecting wall 9 and thus formed to be closed. In these embodiments, when the casting material 3 is cast the direct throughflow thereof within this gap-like opening from the space 5 of one side to the space 5 of the other side is not possible. Thereagainst when the casting material 3 is cast in the device 1 of the embodiment according to FIGS. 5 to 7 this now flows substantially unhindered into the gap 13 (now no longer separated by a partition wall into two spaces) and engages behind the projection 4. Air disposed in the gap 13 can escape freely and without hindrance during inflow of the casting material without being instructed by a connecting wall of the projection 4 to the outer wall 10. The risk of included air bubbles thus no longer exists.

The invention is obviously not restricted to the illustrated embodiments. Further embodiments are possible without departing from the basic concepts. Thus, in the case of larger housings 2 several projections 4 can be provided in succession in direction towards the centre of the device 1. In addition, the number of circular connecting walls 11 can be adapted to the respective purpose of use of the device 1. The connecting wall 11 can obviously also have any other desired geometric course, but can, in particular, also be constructed as a complete cylinder and thus as a rod-shaped connection between the outer wall 10 and projection 4.

What is claimed is:

1. A device for accommodating at least one electrical or electronic component, comprising a housing forming an interior defined by an inner wall surface, in which interior the at least one component is arranged, the at least one component occupying less than all of the interior of the housing, the balance being filled with a casting material, wherein a projection from the inner wall surface encircles the interior and forms an undercut filled by the casting material to lock the casting material to the inner wall surface, wherein the projection continuously encircles the interior and is connected with the housing wall by a strut- or bridge-like connecting wall, and wherein the projection and connecting wall together form a cross-sectional T-shape.

2. The device of claim 1, wherein the projection is arranged in a center region of the housing.

3. The device of claim 2, wherein the casting material comprises polyamide-based hot-melt adhesive.

4. The device of claim 2, wherein the housing has in proximity to the projection at least one injection bore for the casting material.

5. The device of claim 1, wherein the casting material comprises polyamide-based hot-melt adhesive.

6. The device of claim 1, wherein the housing has in proximity to the projection at least one injection bore for the casting material.

7. A device for accommodating at least one electrical or electronic component, comprising a housing forming an interior defined by an inner wall surface, in which interior the at least one component is arranged, the at least one component occupying less than all, of the interior of the housing, the balance being tilled with a casting material, wherein a projection from the inner wall surface encircles the interior and forms an undercut filled by the casting material to lock the casting material to the inner wall surface, wherein the projection encircles the interior in sections, each section being connected to the housing wall by a respective connecting wall, and where in in the connecting walls are formed as cylindrical pedestals.

8. The device of claim 7, wherein the projection is arranged in a center region of the housing.

9. The device of claim 8, wherein the casting material comprises polyamide-based hot-melt adhesive.

10. The device of claim 8, wherein the housing has in proximity to the projection at least one injection bore for the casting material.

11. The device of claim 7, wherein the casting material, comprises polyamide-based hot-melt adhesive.

12. The device of claim 7, wherein the housing has in proximity to the projection at least one injection bore for the casting material.

13. A device for accommodating at least one component, comprising a housing forming an interior defined by an inner wall surface, in which interior the at least one component is arranged, the at least one component occupying less than all of the interior of the housing, the balance being filled with a casting material comprising a hot-melt adhesive, wherein a projection from the inner wall surface encircles the interior and forms an undercut filled by the casting material to lock the casting material to the inner wall surface.

14. The device of claim 13, wherein the projection is arranged in a center region of the housing.

15. The device of claim 14, wherein the housing has in proximity to the projection at least one injection bore for the casting material.

16. The device of claim 13, wherein the casting material comprises polyamide-based hot-melt adhesive.

17. The device of claim 16, wherein the casting material comprises polyamide-based hot-melt adhesive.

18. The device of claim 13, wherein the housing has in proximity to the projection at least one injection bore for the casting material.

19. The device of claim 13, wherein the projection continuously encircles the interior and is connected with the housing wall by a strut- or bridge-like connecting wall.

20. The device of claim 19, wherein the projection and connecting wall together form a cross-sectional T-shape.

21. The device of claim 13, wherein the projection encircles the interior in sections, each section being connected to the housing wall by a respective connecting wall.

22. The device of claim 21, wherein in the connecting walls are formed as cylindrical, pedestals.

* * * * *

UNITED STATES PATENT AND TRADEMARK OFFICE
CERTIFICATE OF CORRECTION

PATENT NO. : 6,674,002 B2
DATED : January 6, 2004
INVENTOR(S) : Muendelein

It is certified that error appears in the above-identified patent and that said Letters Patent is hereby corrected as shown below:

Title page,
Item [54], Title, "ACCOMODATING" should read -- ACCOMMODATING --.
Item [73], Assignee, delete "Iserjohn" should read -- Iserlohn --.

Column 5,
Line 8, delete the "comma".
Line 9, delete "tilled" and insert -- filled --.
Line 15, delete "where in" and insert -- wherein --.

Signed and Sealed this

Seventeenth Day of August, 2004

JON W. DUDAS
*Acting Director of the United States Patent and Trademark Office*